(12) United States Patent
Zhang (10) Patent No.: US 11,640,068 B2
(45) Date of Patent: May 2, 2023

(54) DISPLAY MODULE AND ELECTRONIC DEVICE

(71) Applicant: Lenovo (Beijing) Co., Ltd., Beijing (CN)

(72) Inventor: Zhenhua Zhang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 97 days.

(21) Appl. No.: 17/206,623

(22) Filed: Mar. 19, 2021

(65) Prior Publication Data

US 2021/0405385 A1    Dec. 30, 2021

(30) Foreign Application Priority Data

Jun. 30, 2020    (CN) .......................... 202010622383.1

(51) Int. Cl.
| | |
|---|---|
| *G06F 1/16* | (2006.01) |
| *G02B 27/28* | (2006.01) |
| *H01L 27/32* | (2006.01) |
| *H01L 51/52* | (2006.01) |

(52) U.S. Cl.
CPC ......... *G02B 27/286* (2013.01); *G06F 1/1605* (2013.01); *H01L 27/3234* (2013.01); *H01L 51/5262* (2013.01)

(58) Field of Classification Search
CPC ... G02B 27/286; G06F 1/1605; G06F 1/1637; H01L 27/3234; H01L 51/5262; H01L 27/3232; H01L 27/3286; H01L 27/3267; G09F 9/35
See application file for complete search history.

(56) References Cited

U.S. PATENT DOCUMENTS

2021/0193769 A1 *  6/2021  Bok ..................... G06F 1/1605

FOREIGN PATENT DOCUMENTS

KR        20210078649 A  *  6/2021  ............. H01L 27/32

* cited by examiner

*Primary Examiner* — Donald L Raleigh
(74) *Attorney, Agent, or Firm* — Anova Law Group, PLLC (57) ABSTRACT

A display module includes a first display component including a first light-emitting member and a translucent member, and a second display component including a second light-emitting member. The second display component is arranged at a side away from a light-emitting surface of the first display component, and the second display component and the first display component emit light toward a same side. At least a part of the second light-emitting member overlaps with the translucent member in a light-emitting direction of the first light-emitting member and the second light-emitting member. The second light-emitting member is translucent.

14 Claims, 5 Drawing Sheets

DISPLAY MODULE AND ELECTRONIC DEVICE

CROSS-REFERENCE TO RELATED APPLICATION

This application is a continuation of Chinese Patent Application No. 202010622383.1, filed Jun. 30, 2020, the entire content of which is incorporated herein by reference.

TECHNICAL FIELD

The present disclosure relates to the field of electronic technology and, in particular, to a display module and an electronic device.

BACKGROUND

Full screen has become a popular trend in electronic devices such as mobile phones. The requirement for a screen-to-body ratio (a relative area ratio of a display screen of a device to a front panel of the device) of full-screen designs becomes higher and higher, getting close to 100%.

In a full-screen design, a corresponding camera of the electronic device, for example, a front camera, needs to be designed as an under-screen camera, that is, the camera is located under the display screen of the electronic device. For the under-screen camera, an area of a cover (e.g., a glass cover) of the device display screen over the camera needs to be made as a translucent area, to meet light-entering requirements during imaging. However, a display component of the device has an opaque member, and the opaque member may form specific diffraction under an area of the display screen corresponding to the camera, which may cause blurry imaging.

At present, imaging quality is improved by reducing a proportion of the opaque member of the display component of the under-screen camera area of the display screen of the display component. However, this method may reduce display quality of the camera area of the display screen (for example, a light-emitting diode display component, such as an organic light-emitting diode (OLED) or a mini light-emitting diode (mini-LED), is based on the opaque member for light-emitting display, reducing the proportion of the opaque member, therefore correspondingly reduces the proportion of the display unit in the display component and affects the display quality), and may also cause an obvious difference of the display effect between the camera area and a non-camera area of the display screen, thereby causing the display effect of the entire display screen to be inconsistent.

SUMMARY

One aspect of the present disclosure provides a display module including a first display component including a first light-emitting member and a translucent member, and a second display component including a second light-emitting member. The second display component is arranged at a side away from a light-emitting surface of the first display component, and the second display component and the first display component emit light toward a same side. At least a part of the second light-emitting member overlaps with the translucent member in a light-emitting direction of the first light-emitting member and/or the second light-emitting member. The second light-emitting member transmits light.

Another aspect of the present disclosure provides an electronic device including a main body, a display module arranged at the main body, and an image acquisition device arranged between the main body and the display module and arranged at a side away from a light-emitting direction of the display module. The display module includes a first display component including a first light-emitting member and a translucent member, and a second display component including a second light-emitting member. The second display component is arranged at a side away from the light-emitting surface of the first display component, and the second display component and the first display component emit light to a same side. At least a part of the second light-emitting member overlaps with the translucent member in a light-emitting direction of the first light-emitting member and/or the second light-emitting member. The second light-emitting member transmits light.

DETAILED DESCRIPTION OF THE EMBODIMENTS

Technical solutions of the present disclosure will be described with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

A display module and an electronic device consistent with the embodiments of the present disclosure are used to improve imaging effect of an under-screen camera of the electronic device and ensure display quality of the device display screen in a camera area simultaneously, and correspondingly cause display effects of the camera area and a non-camera area of the electronic device display screen to be consistent.

In some embodiments, the display module consistent with the present disclosure may be applied to an electronic device including an imaging device and a display screen, such as a smart phone, a tablet computer, a laptop, a smart bracelet, a personal digital assistant, a camera, etc. Typically, a relative area ratio of the display screen of the device to a front panel of the device reaches a predetermined threshold. That is, the display screen of the electronic device may use a full-screen design, and the imaging device of the electronic device at least includes a camera set under the display screen (between a main body of the device and the display screen), which may be called the under-screen camera.

Figure 1:
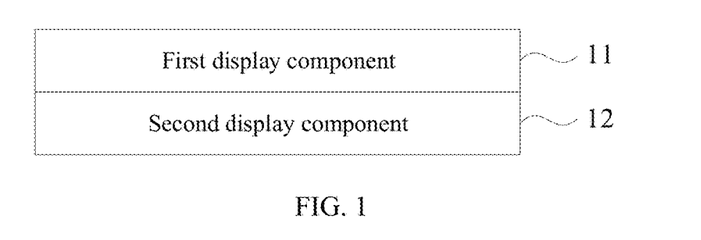
FIG. 1 is a schematic structural diagram of a display module consistent with the embodiments of the disclosure.

FIG. 1 is a schematic structural diagram of a display module consistent with the embodiments of the disclosure. As shown in FIG. 1, in an embodiment, the display module includes a first display component 11 including a first light-emitting member and a translucent member, and a second display component 12 including a second light-emitting member.

The first light-emitting member of the first display component 11 is opaque. That is, the first display component 11 emits light based on at least a part of an opaque member of the first display component 11. The translucent member of the first display component 11 does not emit light by itself.

In some embodiments, the first display component 11 may be a display component, such as an organic light-emitting diode (OLED) or a mini light-emitting diode (mini-LED). When a voltage is applied to both ends of a light-emitting diode display component, such as an OLED or a mini-LED, electrons are output from a cathode of the display component, and holes are output from an anode of the display component. When the electrons encounter the holes, the electrons fill the holes. During combinations of the electrons and the holes, the electrons release energy in the form of photons to realize light-emitting display of the device, such as an OLED or a mini-LED.

The cathode and anode of the device, such as an OLED or a mini-LED, and the light-emitting layer between the cathode and anode of the device constitute the light-emitting member (that is, the first light-emitting member) of the device, such as an OLED or a mini-LED, and the light-emitting member is opaque.

Figure 2:
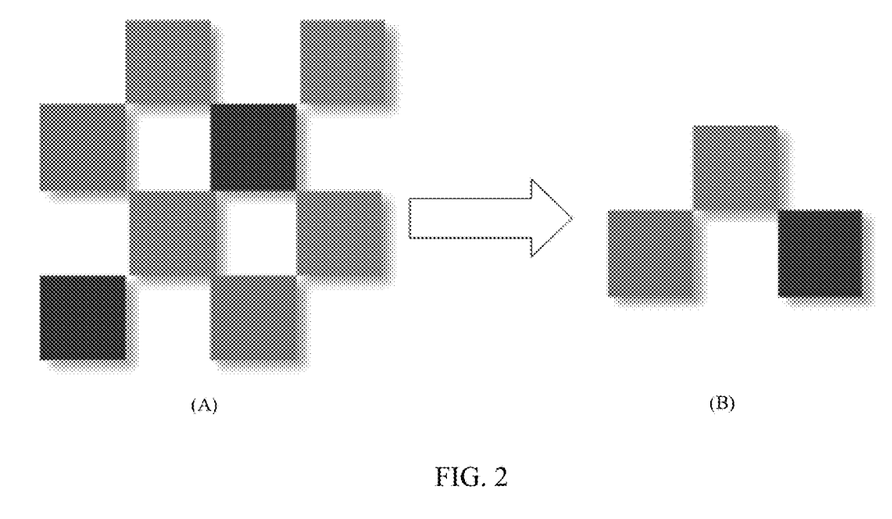
FIG. 2 is a schematic diagram showing reducing a proportion of an opaque member in a display component consistent with the embodiments of the disclosure.

In a full-screen design, a corresponding camera of the electronic device, for example, a front camera, needs to be designed as an under-screen camera, that is, the camera is located under the display screen of the electronic device. For the under-screen camera, an area of a cover (e.g., a glass cover) of the device display screen over the camera needs to be made as a translucent area, to meet light-entry requirements during imaging. However, a display component of the device has an opaque member, such as the opaque member of an OLED or a mini-LED described above, and the opaque member may form specific diffraction under an area of the display screen corresponding to the camera, which may cause blurry imaging. To improve the imaging quality of the under-screen camera, the proportion of the opaque member of the display component of the under-screen camera area in the display component is reduced. FIG. 2 is a schematic diagram showing reducing a proportion of an opaque member in a display component consistent with the embodiments of the disclosure. Each gray-scale box in FIG. 2 represents the opaque member of the display component. Changes from FIG. 2(A) to FIG. 2(B) indicate that the proportion of the opaque member in the display component is reduced to increase the proportion of the translucent member, reduce the diffraction, and improve the imaging quality of the under-screen camera. However, because the first display component 11, such as an OLED or a mini-LED, achieves light emission based on (at least a part of) the opaque member of the first display component 11, and the translucent member does not emit light, reducing the proportion of the opaque member correspondingly reduces the proportion of the display unit in the first display component 11 and affects the display quality. This may also cause an obvious difference of the display effect between the camera area and the non-camera area of the display screen, thereby causing the display effect of the entire display screen to be inconsistent.

To overcome this problem, the display module consistent with the embodiments of the present disclosure includes another display component in a light-emitting direction of the first display component 11, that is, the second display component 12.

Figure 3:
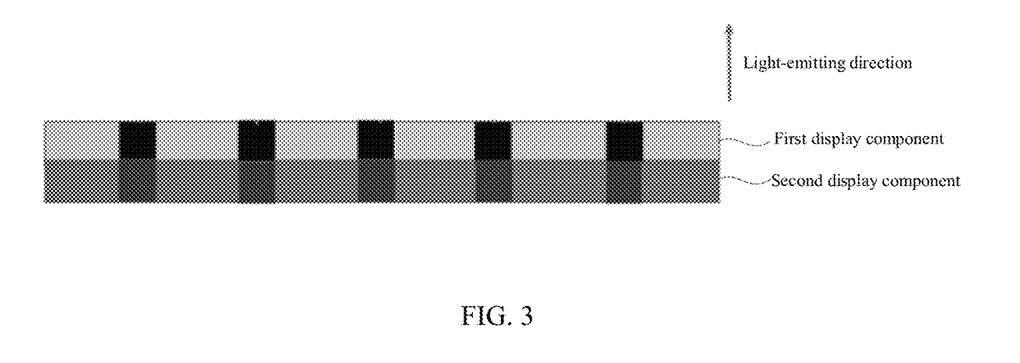
FIG. 3 is a schematic diagram showing a relative position relationship between a first display component and a second display component consistent with the embodiments of the disclosure.

FIG. 3 is a schematic diagram showing a relative position relationship between a first display component and a second display component consistent with the embodiments of the disclosure. As shown in FIG. 3, specifically, the second display component 12 is arranged on a side away from a light-emitting surface of the first display component 11, and the second display component 12 and the first display component 11 emit light to the same side.

Figure 4:
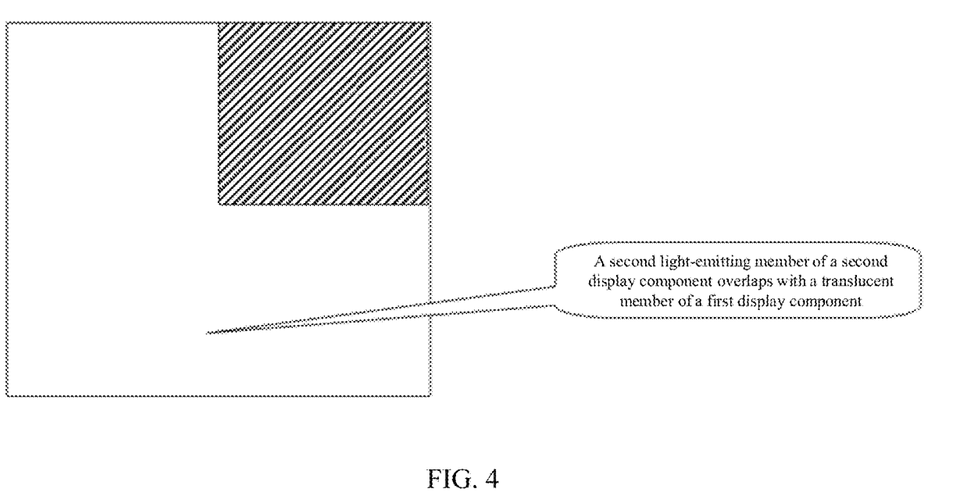
FIG. 4 is a schematic diagram showing a second light-emitting member of the second display component and translucent member of the first display component overlap with each other in a light-emitting direction of the two display components consistent with the embodiments of the disclosure.

In addition, at least a part of the second light-emitting member of the second display component 12 overlaps with the translucent member of the first display component 11 in the light-emitting direction of the first light-emitting member of the first display component 11 and/or the second light-emitting member of the second display component 12. FIG. 4 is a schematic diagram showing a second light-emitting member of the second display component and translucent member of the first display component overlap with each other in a light-emitting direction of the two display components consistent with the embodiments of the disclosure. As shown in FIG. 4, the second light-emitting member of the second display component 12 and the translucent member of the first display component 11 completely overlap with each other in the light-emitting direction of the two display components (not shown in FIG. 4). The light-emitting direction of the two display components may be understood as a direction perpendicular to a graphic plane shown in FIG. 4. A shape of the second light-emitting member of the second display component 12 or the translucent member of the first display component 11 shown in FIG. 4 is only illustrative and does not constitute a limitation on the shape of the second light-emitting member or the translucent member.

The second light-emitting member of the second display component 12 is translucent.

Based on above-described design of structures and the relative position of the first display component 11 and the second display component 12, on one hand, because the second light-emitting member of the second display component 12 is translucent, the light-entry requirements during the imaging of the under-screen camera is met by light transmission characteristics of the translucent member of the first display component 11 and the second light-emitting member of the second display component overlapped with each other in the light-emitting direction of the display module, and the diffraction under the area of the display screen corresponding to the under-screen camera is reduced and the imaging quality of the under-screen camera is improved by increasing the proportion of the translucent member (corresponding reducing the proportion of the opaque member). On the other hand, the second light-emitting member of the second display component 12 may emit light passing through the translucent member of the first display component 11 and may be together with the first light-emitting member of the first display component 11 to emit light to the same side. That is, the first display component 11 and the second display component 12 are complementary to emit light in different areas, thereby improving a light-emitting density of the display module, enlarging a light-emitting display area, correspondingly ensuring the display quality of the device display screen in the camera area, and avoiding the difference of the display effect between the camera area and the non-camera area of the display screen.

The second display component 12 may be a liquid crystal display (LCD) but is not limited to this. Any device, which can realize the light-emitting display based on a translucent member (not limited to backlight or non-backlight mode) of the device, may meet the requirements to the second display component 12 consistent with the embodiments of the disclosure, and may correspondingly be stacked and used with the first display component 11 to realize complementation of the light-emitting areas of the two.

In implementation, the display module consistent with the embodiments of the disclosure may be used as a part of the display screen of the electronic device, and the display module may be set between the under-screen camera of the electronic device and an area of the display cover (e.g., a glass cover) corresponding to the under-screen camera. That is, an implementation manner of a part of the display screen corresponding to the under-screen camera is provided in the present disclosure.

In summary, based on the above-described design of the structure of the display module including the stacking of the first display component and the second display component in the light-emitting direction, and the overlapping of the second light-emitting member of the second display component, which is translucent, and the translucent member of the first display component in the light-emitting direction, not only ensures the light transmission characteristics of the display module, but also realizes the complementation of the light-emitting areas of the two devices. Therefore, when improving the imaging quality of the camera by reducing the proportion of the opaque member of the display module corresponding to the under-screen camera area, based on that the first display component 11 and the second display component 12 are complementary to emit light in the different areas, the light-emitting density of the display module is improved, the light-emitting display area is enlarged, thereby ensuring the display quality of the device display screen in the camera area.

In some embodiments, the second display component 12 further includes an opaque member.

At least a part of the opaque member of the second display component 12 overlaps with the first light-emitting member of the first display component 11 in the light-emitting direction of the first display component 11 and/or the second display component 12.

The light-emitting direction of the first display component 11 refers to the light-emitting direction of the first light-emitting member of the first display component 11, and the light-emitting direction of the second display component 12 refers to the light-emitting direction of the second light-emitting member of the second display component 12. The light-emitting directions of the two are the same, that is, the two devices emit light to the same side. When the display module is applied to an electronic device and used for the display screen area corresponding to the under-screen camera of the electronic device, the light-emitting direction of the first light-emitting member of the first display component 11 and/or the second light-emitting member of the second display component 12 is the direction from the display module to the area corresponding display screen cover (e.g., glass cover).

In practices, the display component needs to be driven to achieve the light-emitting display, and a drive circuit and wiring of the display component are usually not translucent. Therefore, the opaque member of the second display component 12 may at least include the drive circuit and wiring of the second display component 12.

Taking the second display component 12 as an LCD as an example, the opaque member may at least include a thin-film transistor (TFT) drive circuit and wiring of the LCD.

In some embodiments, the opaque member of the second display component 12 may be covered by the first light-emitting member of the first display component 11 in the light-emitting direction.

When the opaque member of the second display component 12 is covered by the first light-emitting member of the first display component 11, the opaque member of the second display component 12 and the first light-emitting member completely overlap with each other in the light-emitting direction. Correspondingly, the second light-emitting member of the second display component 12 and the translucent member of the first display component 11 also completely overlap with each other in the light-emitting direction. Based on the above-described design, the opaque member of the first display component 11 and the opaque member of the second display component 12 completely overlap with each other, and the translucent member of the first display component 11 and the translucent member of the second display component 12 completely overlap with each other. When the device display screen performs light-emitting display based on the first display component and the second display component, better complementation of the light-emitting areas of the two display components may be achieved, better light transmission of the translucent areas of the two display components may be achieved, and light blocking phenomenon of the opaque member of the second display component 12 to the translucent member of the first display component 11 may be avoided.

Figure 5:
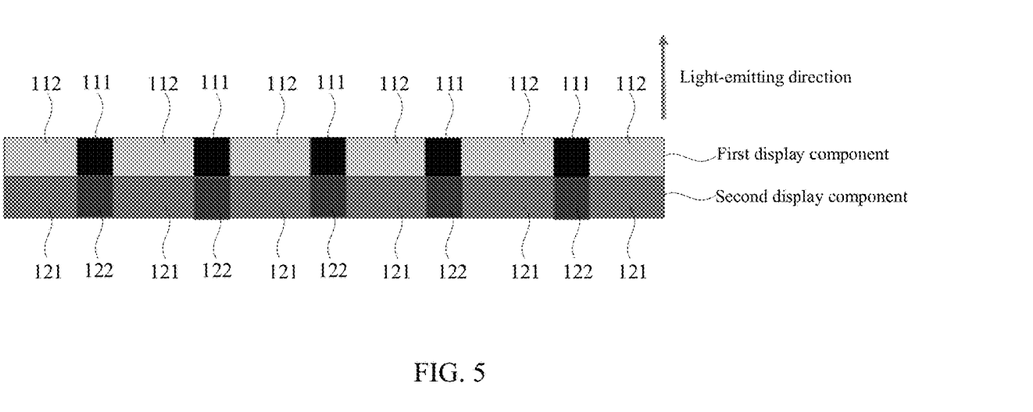
FIG. 5 is a schematic diagram showing each of units included in the first display component and the second display component consistent with the embodiments of the disclosure.

FIG. 5 is a schematic diagram showing each of units included in the first display component and the second display component consistent with the embodiments of the disclosure. As shown in FIG. 5, in an embodiment, the first light-emitting member of the first display component 11 includes at least one first light-emitting unit 111, and the translucent member of the first display component 11 includes at least one translucent unit 112.

The second light-emitting member of the second display component 12 includes at least one second light-emitting unit 121, and the opaque member of the second display component 12 includes at least one opaque unit 122.

In some embodiments, the first light-emitting unit 111 and the translucent unit 112 are alternately arranged in the first display component 11, and the second light-emitting unit 121 and the opaque unit 122 are alternately arranged in the second display component 12.

At least a part of the opaque unit 122 overlaps with the corresponding first light-emitting unit 111 in the light-emitting direction of the first display component 11 and/or the second display component 12.

Based on the above-described design, a complementary arrangement of each the first light-emitting unit 111 of the first display component 11 and each the second light-emitting unit 121 of the second display component 12 in different areas of the light-emitting surface is realized. When the display screen of the electronic device performs a content display, the complementation of the light-emitting areas of the first display component 11 and the second display component 12 may be realized by controlling each the first light-emitting unit 111 of the first display component 11 and each the second light-emitting unit 121 of the second display component 12 to emit light, thereby improving the light-emitting unit density of the display module, enlarging the entire light-emitting display area, correspondingly ensuring the display quality of the area of the device display screen corresponding to the under-screen camera. When performing imaging of the under-screen camera, the translucent member of the first display component 11 and the translucent second light-emitting member of the second display component 12 overlap with each other in the light-emitting direction, thereby meeting the light-entry requirements during the imaging. In addition, because the proportion of the translucent member is increased as much as possible in the design, the diffraction of the area under the display screen corresponding to the under-screen camera is reduced, and the imaging quality is improved.

The opaque unit 122 of the second display component 12 and the corresponding first light-emitting unit 111 of the first display component 11 completely overlap with each other in the light-emitting direction, correspondingly, the second light-emitting unit 121 of the second display component 12 and the translucent unit 112 of the first display component 11 completely overlap with each other in the light-emitting direction, to ensure the better complementary light emission of the two display components during displaying of the electronic device display screen and the better light transmission during the imaging of the under-screen camera.

In some embodiments, the first display component 11 further includes at least one first drive unit 113, and the first drive unit 113 is used to drive the corresponding first light-emitting unit 111 to perform light-emitting display.

The second display component 12 further includes at least one second drive unit 123, and the second drive unit 123 is used to drive the corresponding second light-emitting unit 121 to perform light-emitting display.

The first drive unit 113 and the corresponding second drive unit 123 overlap with each other in the light-emitting direction.

In some embodiments, the number of the first drive unit 113 and the number of the first light-emitting unit 111 are the same to drive the corresponding first light-emitting unit 111 one-to-one to emit light. The number of the second drive unit 123 and the number of the second light-emitting unit 121 are the same to drive the corresponding second light-emitting unit 121 one-to-one to emit light.

Taking the first display component 11 as an OLED or a mini-LED as an example, the first drive unit 113 may include a TFT drive circuit and wiring of the OLED or the mini-LED. Taking the second display component 12 as an LCD as an example, the second drive unit 123 may include a TFT drive circuit and wiring of the LCD. Both of the TFT drive circuits and wiring are opaque.

In practice, the opaque first drive unit 113, such as the TFT drive circuit and wiring of the first display component 11, and the opaque first light-emitting unit 111 may be stacked in the light-emitting direction, while the first drive unit 113 of the first display component 11 and the second drive unit 123 of the second display component 12 are stacked in the light-emitting direction. For example, specifically, the cathode, TFT drive circuit and wiring, and anode of the OLED/mini-LED, and the TFT drive circuit and wiring of the LCD are stacked in an opposite direction of the light-emitting direction. The opaque members of the two display components are stacked to avoid the light blocking phenomenon of the opaque member of the second display component 12 to the translucent member of the first display component 11.

In some embodiments, the first display component 11 includes a light-emitting material and emits light based on the light-emitting material. The second display component 12 uses a side-edge type backlight to achieve light emission.

For example, when the first display component 11 is a light-emitting diode display component, such as an OLED or a mini-LED, the light-emitting material of the first display component 11 may include related materials for respectively realizing an anode, cathode, organic molecules emission layer, and conduction layer of the OLED or the mini-LED. When a voltage is applied to both ends of an OLED or a mini-LED, electrons are output from the cathode to the organic molecule emission layer, and holes are output from the anode to the conductive layer. At an interface of the emitting layer and the conductive layer, the electrons combine with the holes. The electrons fill the holes when the electrons encounter the holes. During combinations of the electrons and the holes, electrons may release energy in a form of photons to achieve light emission of the OLED or mini-LED.

The second display component 12 may be specifically but not limited to an LCD, uses the manner of the side-edge type backlight to achieve the light emission.

For a manner of backlight display, a backlight source needs to be set.

When the display module consistent with the embodiments of the present disclosure is applied to a display screen of an electronic device and is specifically used as a part of the display screen corresponding to an under-screen camera, the display module needs to be set between the under-screen camera and an area of a display screen cover (e.g., a glass cover) corresponding to the under-screen camera. In this scenario, for better imaging of the under-screen camera, a backlight source of the second light-emitting component 12 is not arranged between the under-screen camera and the corresponding device (such as an LCD) of the second light-emitting component 12. The manner of the side-edge type backlight is used to realize the light-emitting display of the second display component 12.

Specifically, the under-screen camera is usually small. In some embodiments, a circle of backlight source lamp beads may be arranged around the under-screen camera area. Taking an LCD as an example, after the backlight source is turned on, light of the backlight source transmits along a side of an LCD light guide plate to a side of LCD liquid crystals to realize illumination to the LCD liquid crystals, and then realize light emission of the LCD based on the backlight illumination.

In some embodiments, the backlight source of the second display component 12 uses the lamp beads having a light emission spectrum consistent with the light emission spectrum of the first display component 11 to achieve a same display effect.

In one embodiment, using the side-edge type backlight for the second display component to realize the light emission may further reduce the influence of the display module corresponding to the under-screen camera area on the imaging of the under-screen camera.

In some embodiments, the first display component further includes a polarizer to filter polarized light.

The polarizer includes a circular polarizer (i.e., polarizer and a quarter-wave plate). In a self-luminous scene of an OLED or a mini-LED, external light is reflected from a cathode of the OLED or mini-LED to cause a user to see themselves in an image displayed on the screen, thereby affecting viewing effect and contrast. The reflection problem may be effectively solved based on the circular polarizer consistent with the embodiments.

A traditional LCD is provided with upper and lower polarizers. In an embodiment, backlight of the second display component 12 includes linearly polarized light to cooperate with the polarizer of the first display component 11, and to avoid the second display component 12 to be provided with upper and lower polarizers, accordingly, thereby removing the upper and lower polarizers of the traditional LCD.

Figure 6:
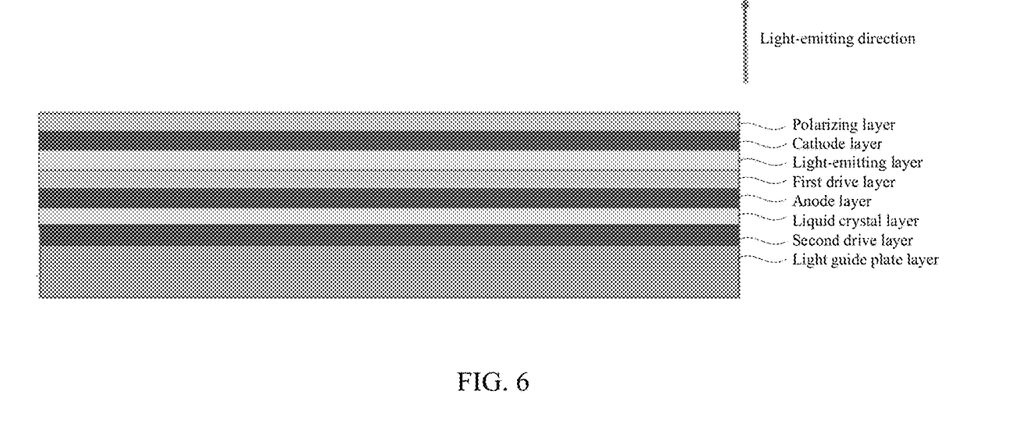
FIG. 6 is a schematic structural diagram showing each of layers stacked of the display module consistent with the embodiments of the disclosure.

FIG. 6 is a schematic structural diagram showing each of layers stacked of the display module consistent with the embodiments of the disclosure. As shown in FIG. 6, in an embodiment, the first display component 11 of the display module is implemented to include a polarizing layer, a cathode layer, a light-emitting layer, a first drive layer, and an anode layer sequentially arranged along the direction opposite of the light-emitting direction of the first light-emitting member of the first display component 11 and/or the second light-emitting member of the second display component 12.

Taking the first light-emitting device 11 as an OLED or a mini-LED as an example, the light-emitting layer may further include an organic molecule emission layer and a conduction layer.

The polarizer of the first display component 11 is provided in the polarizing layer of the first display component 11, and the polarizer in the polarizing layer may include a circular polarizer.

Each of the above-described layers of the first display component 11 includes a translucent member.

In specific implementation, materials used to achieve corresponding functions and the translucent members may be alternately arranged in the corresponding layer of the first display component 11. For example, a TFT drive circuit and wiring of the OLED or mini-LED and the translucent member may be alternately arranged in the first drive layer. Each drive circuit and wiring constitute a first drive device. The material forming an anode and the translucent member are alternately arranged in the anode layer to form a structure in which the anode and the translucent member are alternately arranged. This causes the translucent members of each layer to overlap with each other in the light-emitting direction, and the corresponding members (such as anodes, drives, etc.) other than the translucent members to respectively overlap with each other in the light-emitting direction.

Correspondingly, the translucent member of the first display component 11 is constituted based on the translucent member of each layer of the first display component 11, and the first light-emitting member of the first display component 11 is constituted based on the corresponding members of the cathode layer, the light-emitting layer, and the anode layer of the first display component 11.

Correspondingly, as shown in FIG. 6, the second display component 12 in the display module is implemented to include a liquid crystal layer, a second drive layer, and a light guide plate layer sequentially arranged in the opposite direction of the light-emitting direction of the first light-emitting member of the first display component 11 and/or the second light-emitting member of the second display component 12.

The light guide plate layer may specifically be but is not limited to a translucent light guide plate layer. When the second display component 12 is an LCD, the second drive layer may specifically be a liquid crystal TFT layer. The corresponding members of the liquid crystal layer and the light guide plate layer constitute the second light-emitting member of the second display component 12.

Figure 7:
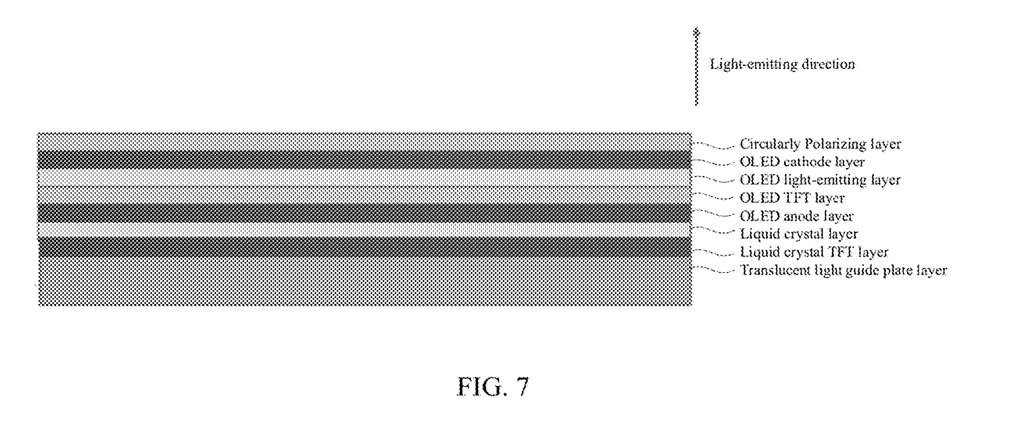
FIG. 7 is a schematic structural diagram showing each of layers stacked of an OLED and an LCD consistent with the embodiments of the disclosure.

Taking the first display component 11 as an OLED and the second display component 12 as an LCD as an example, FIG. 7 is a schematic structural diagram showing each of layers stacked of an OLED and an LCD consistent with the embodiments of the disclosure. The OLED includes a circularly polarizing layer, an OLED cathode layer, an OLED light-emitting layer, an OLED TFT layer, and an OLED anode layer sequentially arranged in the opposite direction of the light-emitting direction of the OLED and/or the LCD. The LCD includes a liquid crystal layer, a liquid crystal TFT layer, and a translucent light guide plate layer sequentially arranged in the opposite direction of the light-emitting direction of the OLED and/or the LCD.

The OLED TFT layer includes alternately arranged translucent members and OLED TFT drive circuits and wiring. The liquid crystal TFT layer of the LCD includes alternately arranged translucent members and LCD TFT drive circuits and wiring. The TFT drive circuits and wiring of the OLED and the TFT drive circuits and wiring of the LCD overlap with each other in the light-emitting direction. In addition, the TFT drive circuit and wiring of the LCD are placed on a side of an opaque anode of an OLED light-emitting unit (i.e., the light-emitting unit includes an anode, a light-emitting layer, and a cathode) away from the light-emitting direction and overlap with the OLED light-emitting unit in the light-emitting direction.

In an embodiment, the first display component 11 and the second display component 12 share a polarizing layer, that is, the circular polarizing layer.

For the second display component 12, such as an LCD, a backlight source may be provided. As described above, the circle of backlight source lamp beads may be arranged around the under-screen camera area to cause the second display component 12 to achieve light emission based on the manner of the side-edge type backlight. To ensure the consistency of the display effects of the two display components, the backlight source of the second display component 12 may use the lamp beads having the emission spectrum consistent with the light emission spectrum of the first display component 11.

When the light-emitting member of the LCD achieves light emission based on the manner of backlight, the light-emitting member of the LCD may emit light to the light-emitting side of the OLED through the translucent member of the OLED, thereby realizing a complementation of the light-emitting areas of the OLED and the LCD.

In an embodiment, the backlight of the second display component 12 includes linearly polarized light to cooperate with the polarizer of the first display component 11, and correspondingly remove the upper and lower polarizers of the traditional LCD, thereby avoid the second display component 12, such as an LCD, to include upper and lower polarizers.

In some embodiments, the polarizer includes a circular polarizer, the liquid crystal layer of the second display component 12 adds a phase of a quarter-wave plate when modulating the phase, to compensate for a quarter-wavelength phase loss caused by the circular polarizer.

In addition, in the embodiments of the present disclosure, the second display component 12, such as an LCD, uses sequential RGB (red, green, and blue) color mixing for color modulation, eliminating a RGB pixel filter of a traditional LCD.

Based on the above-described structure of the display module consistent with the disclosure, not only the light transmission characteristics of the display module are ensured, but also the complementation of the light-emitting areas of the two devices may be achieved. When improving the imaging quality of the camera by reducing the proportion of the opaque member of the display module corresponding to the under-screen camera area, the light-emitting density of the display module may be increased and the light-emitting display area may be enlarged based on the complementary light emission of the first display component and the second display component in different areas, thereby ensuring the display quality of the device screen in the camera area at the same time.

Figure 8:
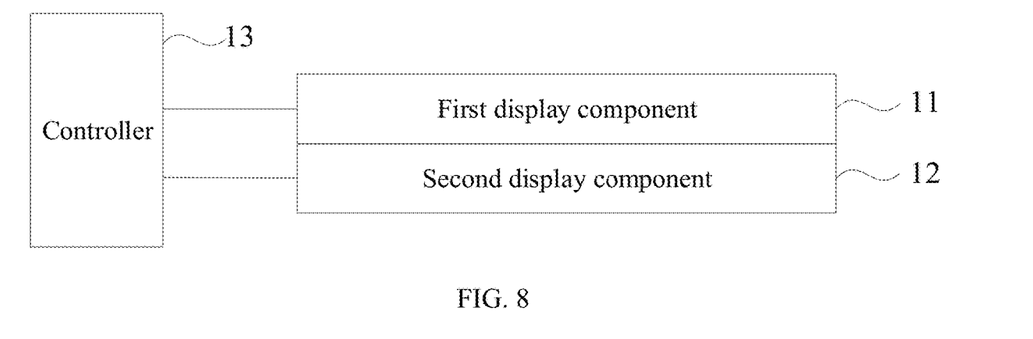
FIG. 8 is another schematic structural diagram of a display module consistent with the embodiments of the disclosure.

FIG. 8 is another schematic structural diagram of an example display module consistent with the embodiments of the disclosure. As shown in FIG. 8, in another embodiment, the display module further includes a controller 13. The controller 13 is used to control the first display component and the second display component to be turned on when a first condition is satisfied, control the first display component and the second display component to be turned off when a second condition is satisfied, control one of the first display component and the second display component to be turned on and another one of the first display component and the second display component to be turned off when a third condition is satisfied.

Figure 9A:
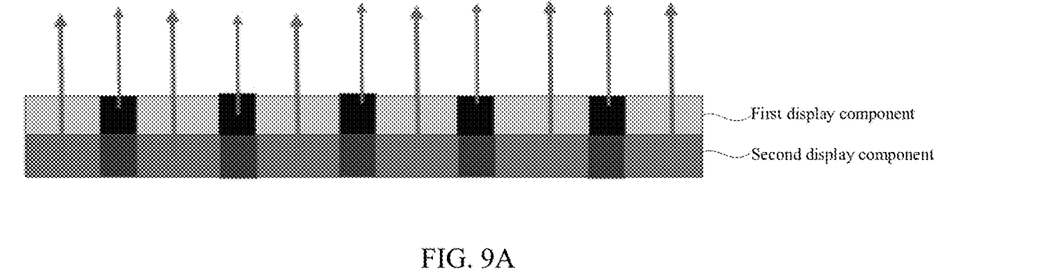
FIG. 9A is a schematic diagram showing the first display component and the second display component are turned on consistent with the embodiments of the disclosure.

In some embodiments, the first condition may be set as a condition indicating the display screen of the electronic device needs to display information. For example, when it is detected that the display screen of the electronic device needs to display information, the first condition may be determined to be satisfied. The controller 13 correspondingly controls both the first display component and the second display component of the display module to be turned on, as shown in FIG. 9A, to ensure that the light-emitting unit density of the area of the display screen corresponding to the under-screen camera does not decrease after increasing the proportion of the translucent member thereof by the complementation of the light-emitting areas of the two display components, and correspondingly ensure the display quality of the screen area corresponding to the under-screen camera (i.e., the display area of the display module of the present disclosure).

Alternately, in another embodiment, the first condition may be set as a condition indicating that the display screen of the electronic device needs to display information for a first specific application scenario. The first specific application scenario may be, for example, an image processing scenario, or a special effect image display scenario of games or movies, etc., which usually have higher requirements for the display quality of the display screen. When it is detected that the electronic device needs to display information for these specific application scenarios, the first condition is determined to be satisfied. The controller 13 correspondingly controls both the first display component and the second display component of the display module to be turned on to ensure the display quality of the screen area corresponding to the under-screen camera (i.e., the display area of the display module of the present disclosure).

The second condition may include but is not limited to a condition that the electronic device needs to turn off the display screen, or a condition that the electronic device needs to perform image capture, etc. When it is detected that the electronic device needs to perform image capture, the controller 13 controls both the first display component and the second display component of the display module to be turned off, to ensure a good imaging effect of the under-screen camera. When it is detected that the electronic device needs to turn off the display screen (such as lock screen, shutdown, etc.), the controller 13 controls both the first display component and the second display component of the display module to be turned off.

The third condition may include but is not limited to a condition indicating that the display screen of the electronic device needs to display information in a second specific application scenario. In some embodiments, the second specific application scenario may be any scenarios other than the first specific application scenario described above. For example, any scenarios other than the image processing scenario, the special effect image display scenario of games or movies games, movies, have relatively low requirements on the display quality of the display. Therefore, only one display component of the display module is controlled to perform light-emitting display while another display component is turned off to save power of the display module and increase service life of the display module accordingly.

Figure 9B:
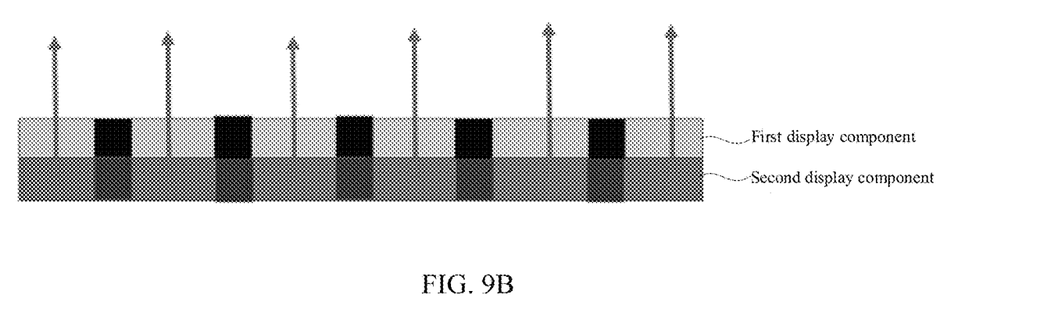
FIG. 9B is a schematic diagram showing the second display component is turned on while the first display component is turned off consistent with the embodiments of the disclosure.
Figure 9C:
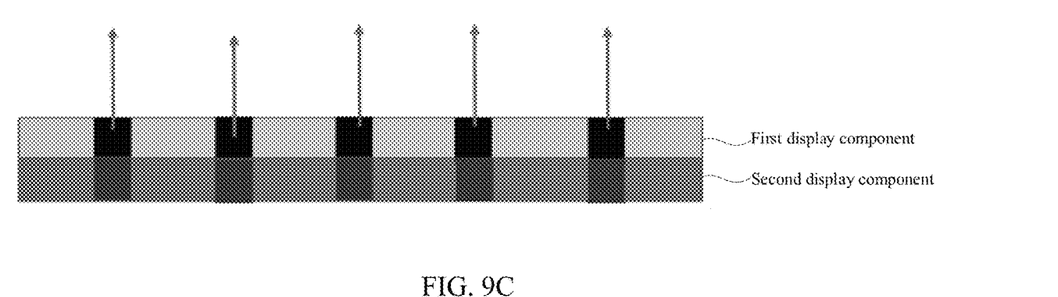
FIG. 9C is a schematic diagram showing the first display component is turned on while the second display component is turned off consistent with the embodiments of the disclosure.

In some embodiments, when the third condition is satisfied, referring to FIG. 9B and FIG. 9C, any one display component of the display module may be controlled to perform light-emitting display while another display component is controlled to be turned off.

In practice, light-emitting diode display components, such as OLEDs or mini-LEDs, have a relatively short service life. Therefore, when an OLED/mini-LED and an LCD are used as the first display component and the second display component, respectively, and the above-described third condition is satisfied, the OLED or mini-LED is controlled to turn off while the LCD is controlled to be turned on, to reduce frequency or duration of use of the OLED or mini-LED in the display module and extend overall service life of the display module.

The settings of the above conditions are not limited. For example, for a scene that imaging by an under-screen camera is needed, during imaging, both the display components of the display module may be controlled to be turned on (i.e., the area of the display screen corresponding to under-screen camera displays information when taking pictures), or both the display components of the display module may be controlled to be turned off (i.e., the area of the display screen corresponding to under-screen camera does not display information when taking pictures, another area of the screen may still display), or any one display component of the display module may be controlled to be turned on while another display component of the display module is controlled to be turned off. There is no restriction here.

In some embodiments, a display screen consistent with the disclosure may be used in the above-described electronic device, such as a smart phone, a tablet computer, a laptop, etc., to provide the electronic device a display screen for information display.

The display screen includes the display module consistent with embodiments of the present disclosure.

The display module is arranged in a predetermined area of the display screen. The predetermined area may be, for example, a corresponding area in an upper left corner, an upper right corner, or an upper middle area of the display screen. A location of the display module is not limited to a specific area of the display screen.

In some embodiments, when the display screen is applied to an electronic device, such as a smart phone, a tablet computer, etc. to provide the electronic device a display screen for information display, a position of the display module of the display screen matches the position of an under-screen camera, specifically, is between the under-screen camera and an area of a screen cover (e.g., a glass cover) corresponding to the under-screen camera. Therefore, the display module may be arranged at a location of the display screen according to a position requirement of the under-screen camera of the electronic device.

Another area of the display screen except for the display module may be realized by a conventional display component, such as an OLED or LCD. In some embodiments, the display module of the display screen and another area except for the display module may be uniformly controlled for brightness and darkness, or the two areas may also be controlled separately, that is, each of the display module of the display screen corresponding to the under-screen camera and another area of the display screen corresponds to a separate control logic and is controlled separately.

Based on the structure of the display module consistent with the disclosure, the display screen not only ensures the light transmission characteristics of the display module, but also realizes the complementation of the light-emitting areas of the two devices of the display module. When improving the imaging quality of the camera by reducing the proportion of the opaque member of the display module, the complementary light emission of the first display component and the second display component in different areas may be used to increase the light-emitting density of the display module and enlarge light-emitting display area of the display module, thereby ensuring the display quality of the device screen in the camera area.

Figure 10:
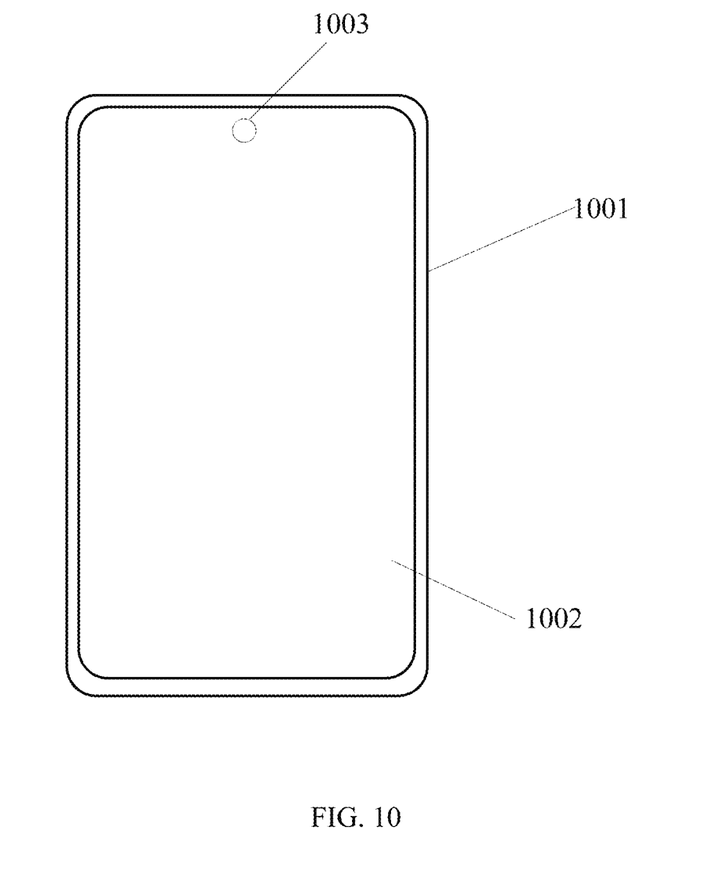
FIG. 10 is a schematic diagram of an electronic device consistent with the embodiments of the disclosure.

FIG. 10 is a schematic diagram of an example electronic device consistent with the embodiments of the disclosure. As shown in FIG. 10, in an embodiment, the electronic device includes a main body 1001, a display screen 1002 consistent with the present disclosure, and an image acquisition device 1003.

The display screen 1002 includes a display module consistent with the present disclosure. The display module is arranged in a predetermined area of the display screen 1002. For example, it may be arranged in a corresponding area in an upper left or upper right corner of the display screen 1002, but is not limited to this. For the description of the structure of the display module in the display screen 1002, reference may be made to the description of the display module in the embodiments above, which is omitted here.

The image acquisition device 1003 is arranged between the main body 1001 and the display screen 1002, and is specifically arranged at a side away from the light-emitting direction of the display module of the display screen 1002.

The image acquisition device 1003 may specifically include a camera arranged between the main body of the electronic device and the display screen of the electronic device, that is, an under-screen camera.

The electronic device consistent with the present disclosure is based on the design structure of the display module of the display screen, which not only ensures the light transmission characteristics of the display module, but also realizes the complementation of the light-emitting areas of the two devices of the display module. When improving the imaging quality of the camera by reducing the proportion of the opaque member of the display module, the complementary light emission of the first display component and the second display component in different areas may be used to increase the light-emitting density of the display module and enlarge light-emitting display area of the display module, thereby ensuring the display quality of the device screen in the camera area.

The various embodiments in this specification are described in a progressive manner, and each embodiment focuses on a difference from other embodiments. For the same and similar parts between the various embodiments, reference may be made to each other.

For the convenience of description, when describing the above system or device, the functions are divided into various modules or units to be described separately. The functions of each unit may be implemented in the same one or more software and/or hardware during implementation of the present disclosure.

Based on the description of the foregoing implementation manners, those skilled in the art may clearly understand that the present disclosure may be implemented in a manner of software plus a general hardware platform. Based on this understanding, part or all of the technical solutions of the disclosure may be embodied in the form of computer program stored in a non-transitory computer-readable storage medium, which can be sold or used as a standalone product. The computer program can include instructions that enable a computer (such as a personal computer, a server, or a network device) to perform part or all of a method consistent with the disclosure. The storage medium can be any medium that can store program codes, for example, a read-only memory (ROM), a random-access memory (RAM), a magnetic disk, a compact disc read-only memory (CD-ROM), etc.

The relational terms "first" and "second" are used for descriptive purposes only to distinguish one entity or operation from another entity or operation and should not be understood as indicating or implying or implicitly indicating any such actual relationship or order between these entities or operations. Moreover, the term "include" or any other variants thereof are intended to cover non-exclusive inclusion. Thus, a process, method, article, or device including a series of elements not only includes those elements, but also includes any other elements that are not explicitly listed, or also includes elements inherent to the process, method, article, or device. Unless otherwise defined, the element defined by the sentence "including a . . . " does not exclude the existence of any other identical elements in the process, method, article, or device including the element.

Other embodiments of the disclosure will be apparent to those skilled in the art from consideration of the specification and practice of the embodiments disclosed herein. It is intended that the specification and examples be considered as example only and not to limit the scope of the disclosure, with a true scope and spirit of the invention being indicated by the following claims.

What is claimed is:

1. A display module, comprising:
a first display component including a first light-emitting member and a translucent member; and
a second display component including a second light-emitting member and an opaque member;
wherein:
the second display component is arranged at a side away from a light-emitting surface of the first display component, and the second display component and the first display component emit light toward a same side;
at least a part of the second light-emitting member overlaps with the translucent member in a light-emitting direction of the first light-emitting member and the second light-emitting member;
the second light-emitting member is translucent;
the first light-emitting member is opaque; and
at least a part of the opaque member overlaps with the first light-emitting member in the light-emitting direction.

2. The display module of claim 1, wherein the opaque member is covered by the first light-emitting member in the light-emitting direction.

3. The display module of claim 1, wherein:
the first light-emitting member includes a first light-emitting unit, and the translucent member includes a translucent unit; and
the second light-emitting member includes a second light-emitting unit, and the opaque member includes an opaque unit;
wherein the first light-emitting unit and the translucent unit included in the first display component are alternately arranged, the second light-emitting unit and the opaque unit included in the second display component are alternately arranged, and at least a part of the opaque unit overlaps with the corresponding first light-emitting unit in the light-emitting direction.

4. The display module of claim 3, wherein:
the first display component further includes a first drive unit configured to drive the corresponding first light-emitting unit to perform light-emitting display;
the second display component further includes a second drive unit configured to drive the corresponding second light-emitting unit to perform light-emitting display; and
the first drive unit and the corresponding second drive unit overlap with each other in the light-emitting direction.

5. The display module of claim 1, wherein:
the first display component includes a luminescent material and emits light using the luminescent material; and
the second display component uses a side-edge type backlight to achieve light emission.

6. The display module of claim 5, wherein the first display component further includes a polarizer, and backlight of the second display component includes linearly polarized light to cooperate with the polarizer of the first display component, and the second display component being without upper and lower polarizers.

7. The display module of claim 1, further comprising:
a controller configured to:
control the first display component and the second display component to be turned on in response to a first condition being satisfied;
control the first display component and the second display component to be turned off in response to a second condition being satisfied; and
control one of the first display component and the second display component to be turned on and another one of the first display component and the second display component to be turned off in response to a third condition being satisfied.

8. An electronic device, comprising:
a main body;
a display module arranged at the main body including:
a first display component including a first light-emitting member and a translucent member; and
a second display component including a second light-emitting member and an opaque member;
wherein:
the second display component is arranged at a side away from a light-emitting surface of the first display component, and the second display component and the first display component emit light toward a same side;
at least a part of the second light-emitting member overlaps with the translucent member in a light-emitting direction of the first light-emitting member and the second light-emitting member;
the second light-emitting member is translucent;
the first light-emitting member is opaque; and
at least a part of the opaque member overlaps with the first light-emitting member in the light-emitting direction; and
an image acquisition device arranged between the main body and the display module and arranged at a side away from the light-emitting direction of the display module.

9. The display module of claim 8, wherein the opaque member is covered by the first light-emitting member in the light-emitting direction.

10. The display module of claim 8, wherein:
the first light-emitting member includes a first light-emitting unit, and the translucent member includes a translucent unit; and
the second light-emitting member includes a second light-emitting unit, and the opaque member includes an opaque unit;
wherein the first light-emitting unit and the translucent unit included in the first display component are alternately arranged, the second light-emitting unit and the opaque unit included in the second display component are alternately arranged, and at least a part of the opaque unit overlaps with the corresponding first light-emitting unit in the light-emitting direction.

11. The display module of claim 10, wherein:
the first display component further includes a first drive unit configured to drive the corresponding first light-emitting unit to perform light-emitting display;
the second display component further includes a second drive unit configured to drive the corresponding second light-emitting unit to perform light-emitting display; and
the first drive unit and the corresponding second drive unit overlap with each other in the light-emitting direction.

12. The display module of claim 8, wherein:
the first display component includes a luminescent material and emits light based on the luminescent material; and
the second display component uses a side-edge type backlight to achieve light emission.

13. The display module of claim 12, wherein the first display component further includes a polarizer, and backlight of the second display component includes linearly polarized light to cooperate with the polarizer of the first display component, and the second display component being without upper and lower polarizers.

14. The display module of claim 8, further comprising:
a controller configured to:
- control the first display component and the second display component to be turned on in response to a first condition being satisfied;
- control the first display component and the second display component to be turned off in response to a second condition being satisfied; and
- control one of the first display component and the second display component to be turned on and another one of the first display component and the second display component to be turned off in response to a third condition being satisfied.

\* \* \* \* \*